(12) United States Patent
Matsudai et al.

(10) Patent No.: US 9,391,070 B2
(45) Date of Patent: Jul. 12, 2016

(54) SEMICONDUCTOR DEVICE

(71) Applicant: KABUSHIKI KAISHA TOSHIBA, Tokyo (JP)

(72) Inventors: Tomoko Matsudai, Shibuya Tokyo (JP); Tsuneo Ogura, Kamakura Kanagawa (JP); Bungo Tanaka, Ageo Saitama (JP)

(73) Assignee: KABUSHIKI KAISHA TOSHIBA, Toyko (JP)

( * ) Notice: Subject to any disclaimer, the term of this patent is extended or adjusted under 35 U.S.C. 154(b) by 0 days.

(21) Appl. No.: 14/633,051

(22) Filed: Feb. 26, 2015

(65) Prior Publication Data

US 2016/0079235 A1    Mar. 17, 2016

(30) Foreign Application Priority Data

Sep. 11, 2014    (JP) .................. 2014-185706

(51) Int. Cl.
| | |
|---|---|
| *H01L 29/72* | (2006.01) |
| *H01L 27/06* | (2006.01) |
| *H01L 29/739* | (2006.01) |
| *H01L 29/861* | (2006.01) |
| *H01L 29/10* | (2006.01) |
| *H01L 29/06* | (2006.01) |

(52) U.S. Cl.
CPC ........ *H01L 27/0635* (2013.01); *H01L 29/0696* (2013.01); *H01L 29/1095* (2013.01); *H01L 29/7397* (2013.01); *H01L 29/861* (2013.01)

(58) Field of Classification Search
USPC ........................................... 257/140
See application file for complete search history.

(56) References Cited

U.S. PATENT DOCUMENTS

| | | | | |
|---|---|---|---|---|
| 4,618,872 A | * | 10/1986 | Baliga ................ | H01L 23/522 257/140 |
| 2012/0193676 A1 | * | 8/2012 | Bobde ................ | H01L 29/7391 257/140 |
| 2014/0231867 A1 | * | 8/2014 | Yamashita ........... | H01L 29/872 257/140 |
| 2015/0243656 A1 | | 8/2015 | Ogura et al. | |

FOREIGN PATENT DOCUMENTS

| | | |
|---|---|---|
| JP | 2013-201237 | 10/2013 |
| JP | 2015-109341 A | 6/2015 |

* cited by examiner

*Primary Examiner* — Thao P Le
(74) *Attorney, Agent, or Firm* — Patterson & Sheridan, LLP

(57) ABSTRACT

A semiconductor device includes first electrode, first semiconductor layer of first conductivity type on the first electrode, second semiconductor layer of second conductivity type on the first semiconductor layer, third semiconductor layer of the first conductivity type on second semiconductor layer, fourth semiconductor layer of the second conductivity type selectively located on the third semiconductor layer, gate electrode through the third and fourth semiconductor layers and into the second semiconductor layer and insulated therefrom, second electrode on the fourth semiconductor layer, fifth semiconductor layer of the second conductivity type between the first electrode and the second semiconductor layer, sixth semiconductor layer of the first conductivity type on the second semiconductor layer contacting the second electrode, and seventh semiconductor layer of the first conductivity type in the second and sixth semiconductor layers, such that the bottom thereof is closer to the first electrode than the bottom of the gate insulating film.

20 Claims, 9 Drawing Sheets

US 9,391,070 B2

SEMICONDUCTOR DEVICE

CROSS-REFERENCE TO RELATED APPLICATION

This application is based upon and claims the benefit of priority from Japanese Patent Application No. 2014-185706, filed Sep. 11, 2014, the entire contents of which are incorporated herein by reference.

FIELD

Embodiments described herein relate generally to a semiconductor device.

BACKGROUND

Recently, Reverse Conducting-IGBT (RC-IGBT) with an Insulated Gate Bipolar Transistor (IGBT) and a diode formed on the same substrate has been in active development. One of the structural elements of the IGBT is a gate region extending in a trench. A p type base layer is etched to make a trench therein, and on the surfaces of the trench, an oxide film is formed as a gate oxide film. Thereafter, an electrode material is formed or located over the gate oxide film covering the trench surfaces, to form the trench as a gate region. An IGBT having the gate trench structure can make a channel portion of the resulting device denser than in the case of using the planar structure with a gate oxide film and a gate electrode formed thereover on the upper surface of the base layer, and thus achieving increased current density where the trench style gate is used.

However, the trench electrode structure also presents some issues. When a distance between adjacent trench electrodes is large, at the trench electrode near a terminal end portion of the device, the electric field is concentrated in the bottom of the trench when the device is in a reverse bias state, resulting in a reduction in the static breakdown voltage and risk of device destruction. In an attempt to ameliorate these issues, in trench electrodes near the terminal end portion and widely spaced trench electrodes, the bottom of the trench is covered with a diffusion layer having a higher dopant concentration in order to not generate a concentration of the electric field in the bottom of the trench.

In the RC-IGBT, however, since the IGBT and the diode are formed on the same substrate, there necessarily exists at least one location where the IGBT is close to the diode. A trench electrode of the IGBT is to be located in this close portion, where the concentration of the electric field occurs. When the diode is formed as a planar structure for the purpose of improving characteristics, the concentration of the electric field in the adjacent portions of the IGBT and the diode is avoided. When the diode structure is also formed inwardly of the substrate, a method for avoiding the concentration of the electric field in the close portion is also desired.

DETAILED DESCRIPTION

In general, according to one embodiment, there is provided a semiconductor device capable of suppressing the likelihood of destruction thereof.

According to one embodiment, there is provided a semiconductor device including: a first electrode; a first region including a first semiconductor layer of a first conductivity type on the first electrode, a second semiconductor layer of a second conductivity type on the first semiconductor layer, a third semiconductor layer of the first conductivity type on the second semiconductor layer, a fourth semiconductor layer of the second conductivity type selectively located on the third semiconductor layer, and a gate electrode extending through the third and fourth semiconductor layers and into the second semiconductor layer and insulated therefrom; a second electrode on the fourth semiconductor layer; and a fifth semiconductor layer of the second conductivity type between the first electrode and the second semiconductor layer; a sixth semiconductor layer of the first conductivity type on the second semiconductor layer contacting the second electrode; and a seventh semiconductor layer of the first conductivity type in the second semiconductor layer and the sixth semiconductor layer, such that the bottom thereof is closer to the first electrode than the bottom of the gate insulating film.

Embodiments of the invention will be hereinafter described with reference to the drawings.

First Embodiment

A first embodiment will be described.

Figure 1:
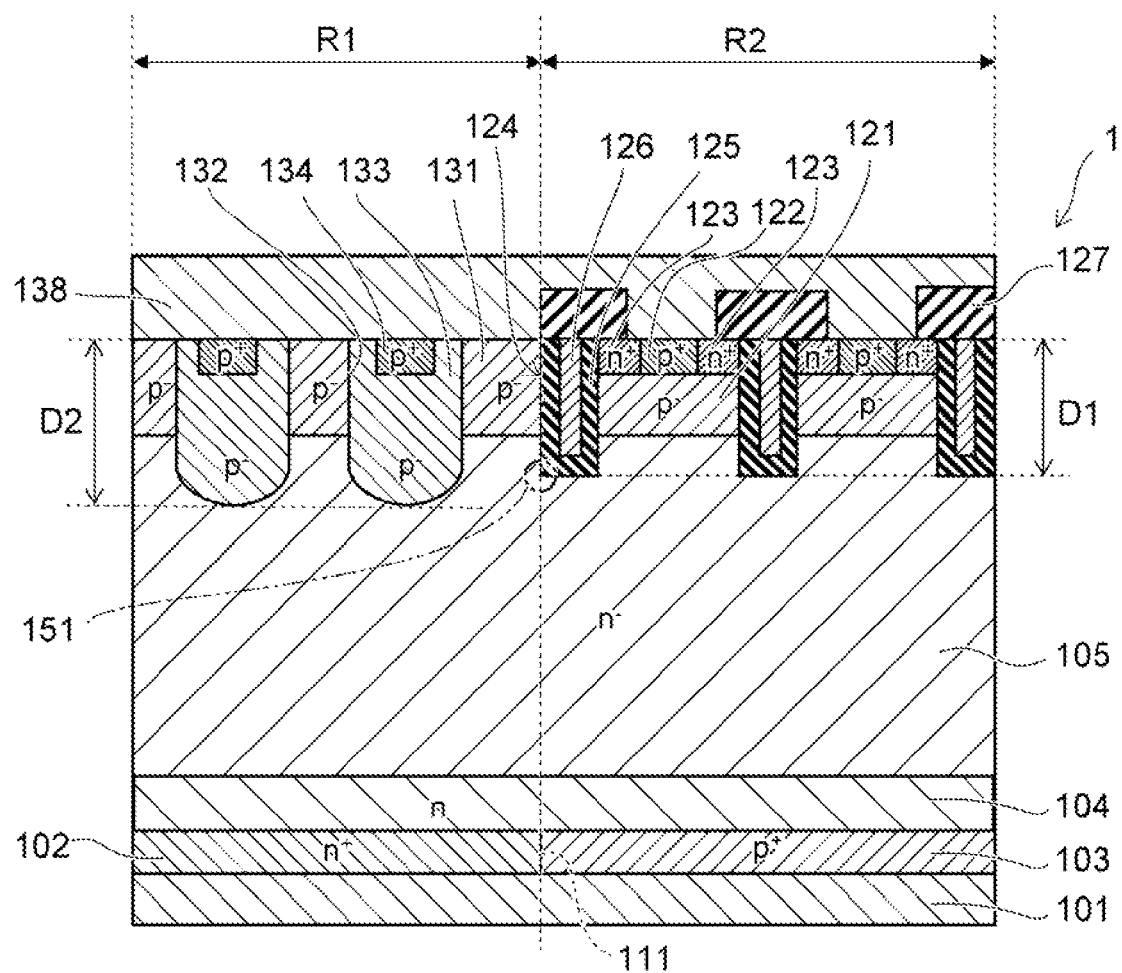
FIG. 1 is a cross sectional view showing a semiconductor device according to a first embodiment.

FIG. 1 is a cross sectional view showing a semiconductor device according to the embodiment.

The semiconductor device according to the embodiment is an RC-IGBT.

At first, a structure of the semiconductor device according to the embodiment will be described.

As illustrated in FIG. 1, a semiconductor device 1 according to the embodiment includes a diode region R1 and an IGBT region R2. In the semiconductor device 1, a cathode electrode 101 is provided, and an n+ type cathode layer 102 and a p+ type drain layer 103 are provided on the cathode electrode 101. The cathode layer 102 is provided in the diode region R1 and the drain layer 103 is provided in the IGBT region R2. The diode region R1 and the IGBT region R2 are directly abut and contact other at boundary 111.

An n type buffer layer 104 is provided on the cathode layer 102 and the drain layer 103 of the diode region R1 and the IGBT region R2. An n− type first base layer 105 is provided on the buffer layer 104.

The effective dopant concentration of the n+ type cathode layer 102 is higher than that of the n type buffer layer 104, and the effective dopant concentration of the n type buffer layer 104 is higher than that of the n− type first base layer 105.

In this specification, "the effective dopant concentration" means the concentration of the dopant attributing to the conductivity of the semiconductor material and in the case of including both of the dopant that is a donor and the dopant that is an acceptor, it means the concentration obtained by excluding any offset due to the presence of both.

In the IGBT region R2, a p− type second base layer 121 is provided on the first base layer 105. A p+ type first contact layer 122 is provided on a part of the second base layer 121. An n+ type source layer 123 is provided on the other portions of the second base layer 121 where the first contact layer 122 is not provided. The effective dopant concentration of the p+ type first contact layer 122 is higher than that of the p− type second base layer 121. The effective dopant concentration of the n+ type source layer 123 is higher than that of the n type buffer layer 104.

In the IGBT region R2, a trench 124 extends through the source layer 123 and the second base layer 121 and inwardly of the first base layer 105. Thus, the bottom surface of the trench 124 is positioned lower than the bottom surface of the second base layer 121. A gate insulating film 125 is provided on the inner surfaces of the trench 124. A gate electrode 126 is provided within the trench over the gate insulating film, such that the gate insulating film is present between the gate electrode 126 and the first base layer 105, the second base layer 121, and the source layer 123.

In the diode region R1, a p− type first anode layer 131 is provided on the first base layer 105. A p− type second anode layer 133 is provided between the p− type first anode layer 131 and extends inwardly of the first base layer 105 than the boundary of the p− type first anode layer 131 and the first base layer 105. The trench 124 and the second anode layer 133 extend in a direction perpendicular to, i.e, inwardly and outwardly of the plane of FIG. 1, in a line shape.

A p+ type second contact layer 134 is provided in the middle, in the width direction, of the second anode layer 133 and has an upper surface generally coplanar with, or terminating with, the top surface of the second anode layer 133. The effective dopant concentration of the p+ type second contact layer 134 is higher than that of the p− type first anode layer 131 and the p− type second anode layer 133.

The first anode layer 131 nearest to the IGBT region R2 of the RC IGBT abuts the gate insulating film 125 of the gate electrode 126 nearest to the diode region R1 at the boundary 111. A distance D2 from the top surface of the second anode layer 133 (or the second contact layer 134) to the deepest portion of the second anode layer 133 is equal to or greater than a distance D1 from the top surface of the trench to the bottom surface of the trench 124. In short, the following expression 1 is satisfied.

$$D2 > D1 \qquad \text{[Expression 1]}$$

An insulating film 127 is provided on the whole top surface of the insulating film 125 and gate electrode 126 in trench 124 and a part of the top surface of the source layer 123 in the IGBT region R2. An anode electrode 138 is provided on the other part of the top surface of the source layer 123 where the insulating film 127 is not provided, and on the top surface of the insulating film 127, the first contact layer 122, the first anode layer 131, the second anode layer 133, and the second contact layer 134, across the whole region including the IGBT region R2 and the diode region R1.

The operation of the semiconductor device according to the embodiment will now be described.

In a state where the anode electrode 138 is grounded and a positive voltage is applied to the cathode electrode 101, when a voltage of a threshold value and more is applied to the gate electrode 126, a channel region is formed in the IGBT region R2 where a current of electrons flows and additional holes are injected from the drain layer 103 to the first base layer 105, hence to convert the semiconductor device 1 into a conductive state in the IGBT region R2. On the other hand, when the potential of the gate electrode 126 is less than the threshold value, the IGBT region R2 is in an OFF state.

When the voltage applied to the anode electrode 138 is higher than the voltage applied to the cathode electrode 101, holes are injected from the second contact layer 134 to the first base layer 105 in the diode region R1, and electrons are injected from the cathode layer 102 to the first base layer 105, hence to convert the semiconductor device 1 into a conductive state in the diode region R1.

From the viewpoint of the static breakdown voltage design, as illustrated in FIG. 1, when a reverse bias is applied to the IGBT region R2, the electric field concentrates is concentrated in the vicinity of an edge portion 151 of the bottom surface of the trench 124 in the IGBT region R2 nearest to the diode region R1 at boundary 111. When the electric field concentrates in the vicinity of the edge portion 151, an avalanche effect easily occurs at this portion and the static breakdown voltage in the semiconductor device 1 is reduced.

Generally, the bottom portion of the trench 124 is apt to be formed in a curve, and when the edge portion 151 where the bottom surface of the trench 124 exists relative to the boundary 111 cannot be determined, a portion of the lower lateral surface of the trench 124 at the boundary 111 becomes the edge portion 151.

Next, the effects of the semiconductor device 1 according to the embodiment will be described.

As illustrated in FIG. 1, the second anode layer 133 is provided in the diode region R1, in the semiconductor device 1 according to the embodiment. The distance D2 from the top surface of the second anode layer 133 (or the second contact layer 134) to the deepest portion of the second anode layer 133 in the diode region R1 is equal to or longer than the distance D1 from the top surface to the bottom surface of the trench 124 in the IGBT region R2.

According to this, when a reverse bias is applied to the IGBT region R2, the concentration of the electric field in the vicinity of the edge portion 151 is reduced. That is because in the adjacent portion of the diode region R1, during an application of reverse bias, depletion starts from the pn junction between the first and second anode layers 131 and 133 and the first base layer 105. Accordingly, in the potential distribution, the equipotential surface is found in the lower portion of the second anode layer 133 and the lower portion of the trench 124. Further, by forming the second anode layer 133 deeper into the base layer 105 than the trench 124, the concentration of the electric field in the vicinity of the edge portion 151 in the bottom portion of the trench 124 is effectively avoided. By avoiding the concentration of the electric field, a reduction in the static breakdown voltage in the IGBT is avoided. As the result, there is provided a semiconductor device capable of suppressing the destruction thereof caused by the concentration of the electric field in the bottom portion of the trench 124. This is the same effect when the trenches 124 are closely arranged.

The second anode layer 133 is generally formed according to the ion implantation or thermal diffusion methods; however, it may be formed in the following method. A trench 132 is formed into the first anode layer 131 in a direction perpendicular to the bottom surface of the first anode layer 131 in the direction of the first base layer 105, in such a way that the deepest portion of the trench 132 is positioned lower than the bottom surface of the first anode layer 131. A p− type doped semiconductor may be deposited in the trench 132, to form the second anode layer 133.

Second Embodiment

Next, a second embodiment will be described.

Figure 2:
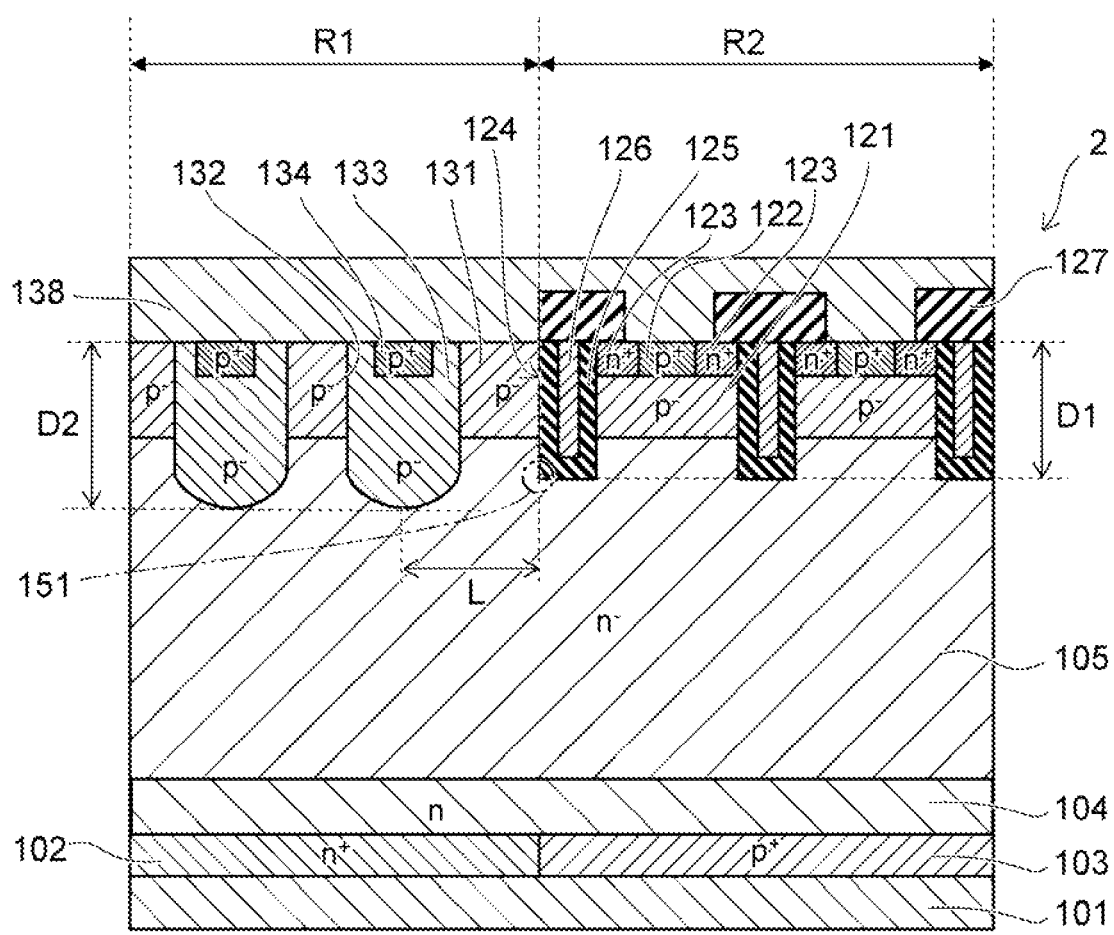
FIG. 2 is a cross sectional view showing a semiconductor device according to a second embodiment.

FIG. 2 is a cross sectional view showing a semiconductor device according to the embodiment.

Figure 3:
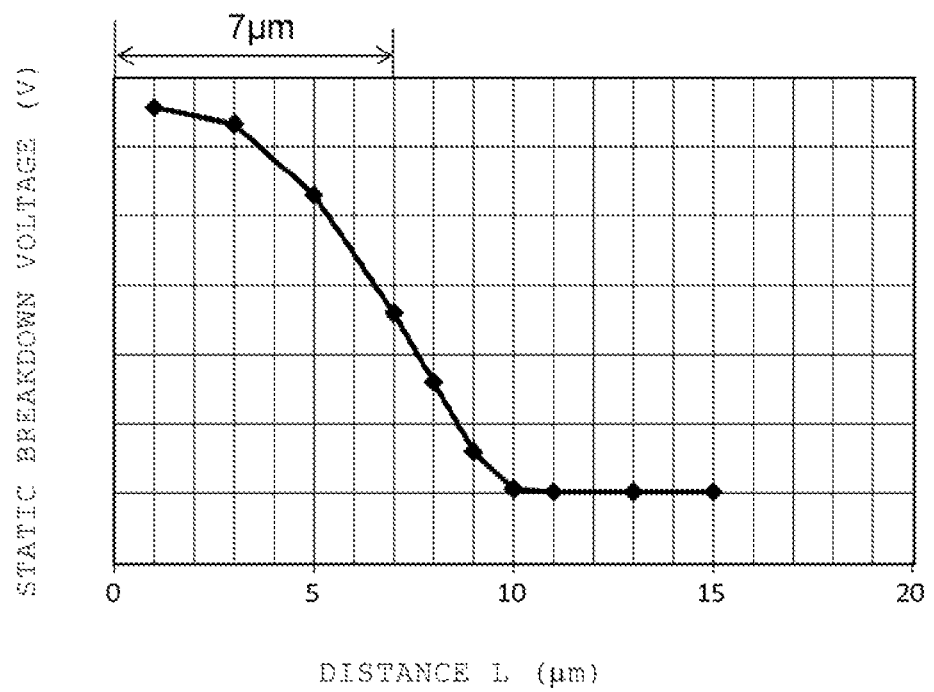
FIG. 3 is a graph showing a static breakdown voltage in the semiconductor device according to the second embodiment with a distance L shown in FIG. 2 indicated in the horizontal axis and a static breakdown voltage of the IGBT indicated in the vertical axis.

FIG. 3 shows the result of the device simulation and it is a graph showing a static breakdown voltage in the semiconductor device according to the embodiment, with a distance L from the lateral surface of the trench 124 nearest to the second anode layer 133 on the side of the second anode layer 133 to the center of the second anode layer 133 indicated in the horizontal axis and the static breakdown voltage of the IGBT indicated in the vertical axis.

As illustrated in FIG. 2, the semiconductor device 2 according to the embodiment is different from the semiconductor device 1 of FIG. 1 of the above-described first embodiment in that the distance L from the lateral surface of the trench 124 nearest to the second anode layer 133 on the side of the second anode layer 133 to the center of the second anode layer 133 is 7 μm and less, as illustrated in the following expression 2.

$$L \leq 7 \mu m$$ [Expression 2]

The structure of the semiconductor device according to the embodiment other than the above is the same as that of the semiconductor device according to the above-described first embodiment.

Next, the operation and effect of the semiconductor device according to the embodiment will be described.

As illustrated in FIG. 3, in the semiconductor device 2 according to the embodiment, as the distance L gets larger the static breakdown voltage is reduced. Until the distance L becomes 7 μm, the slope of the graph indicating the reduction degree (negative slope) of the static breakdown voltage is increasing. When the distance L is 7 μm, the negative inclination of the graph (negative slope) is the maximum. In the range of the distance L from 7 μm to 11 μm inclusive, the inclination of the graph (negative slope) gradually gets smaller. When the distance L is more than 11 μm, the inclination of the graph is almost zero and the static breakdown voltage remains low at a constant value.

When the space between the second anode layer 133 and the trench 124 is large, the equipotential surface is distributed deeper into the first anode layer 131 between the second anode layer 133 and the trench 124 and the concentration of the electric field occurs in the vicinity of the edge portion 151 of the trench 124. Therefore, the space between the second anode layer 133 and the trench 124 is narrowed not to generate the equipotential distribution extending to the side of the first anode layer 131, which is effective in maintaining the static breakdown voltage.

As illustrated in FIG. 3, until the distance L is 7 μm, a reduction of the static breakdown voltage is gradual; around 7 μm, an inflexion point of inclination appears and the reduction in the static breakdown voltage gets larger; and then, the static breakdown voltage gets low at a constant value.

In the semiconductor device 2 according to the embodiment, it is preferable that the distance L is 7 μm and less in order to obtain the desired breakdown voltage characteristics. As a result, the reduction of the static breakdown voltage in the IGBT is reliably avoided.

The operation and effect of the semiconductor device according to the embodiment other than the above are the same as those in the semiconductor device according to the above-mentioned first embodiment.

Third Embodiment

Next, a third embodiment will be described.

Figure 4:
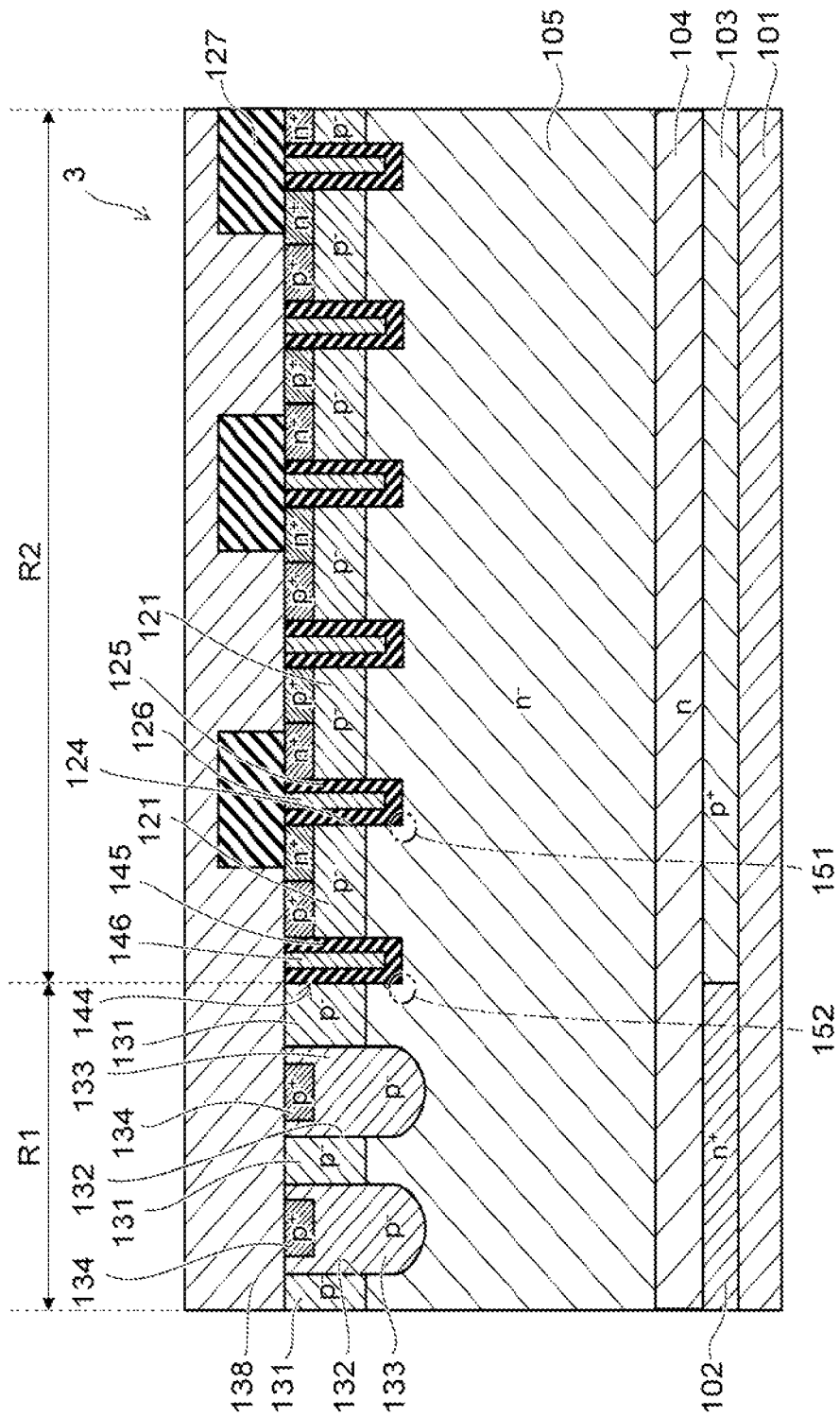
FIG. 4 is a cross sectional view showing a semiconductor device according to a third embodiment.

FIG. 4 is a cross sectional view showing a semiconductor device according to the embodiment.

As illustrated in FIG. 4, a semiconductor device 3 according to the embodiment is different from the semiconductor device 1 according to the above-mentioned first embodiment in that one of a plurality of trenches 124 in the IGBT region R2 is changed to a dummy trench 144, i.e., one having a non-operational electrode therein.

The dummy trench 144 has the same structure as the trench 124. Specifically, the dummy trench 144 is formed by etching the second base layer 121 in a direction perpendicular to the bottom surface of the second base layer 121. The bottom surface of the dummy trench 144 is positioned at the same level as the bottom surface of the trenches 124 having operational electrodes therein. A dummy gate insulating film 145 similar to the gate insulating film 125 is provided on the inner surface of the dummy trench 144. A dummy gate electrode 146 similar to the gate electrode 126 is provided in the dummy trench 144 within the dummy gate insulating film 145.

The insulating film 127 is not provided on the dummy trench 144. Therefore, the dummy gate electrode 146 is connected to the anode electrode 138. The connection location of the dummy gate electrode 146 with the anode electrode 138 may be positioned above the dummy gate electrode 146 or in the outer peripheral portion of the semiconductor device 3.

Here, as the trench gate in the IGBT region R2 nearest to the side of the diode region R1, any of the dummy trench 144 and an operational trench 124 may be provided.

The structure of the semiconductor device according to the embodiment other than the above is the same as that of the semiconductor device according to the above-mentioned first embodiment.

As illustrated in FIG. 4, in the semiconductor device 3 according to the embodiment, the electric field is generated not only in the trench 124 but also in the vicinity of the edge portion 152 where the bottom surface of the dummy trench 144 crosses the lateral surface thereof. However, the concentration of the electric field in the vicinity of the edge portion 151 where the bottom surface of the trench 124 nearest to the diode region R1 in the IGBT region R2 crosses the lateral surface thereof is reduced.

The operation and effect of the semiconductor device according to the embodiment other than the above are the same as those of the semiconductor device according to the above-mentioned first embodiment.

Fourth Embodiment

Next, a fourth embodiment will be described.

Figure 5:
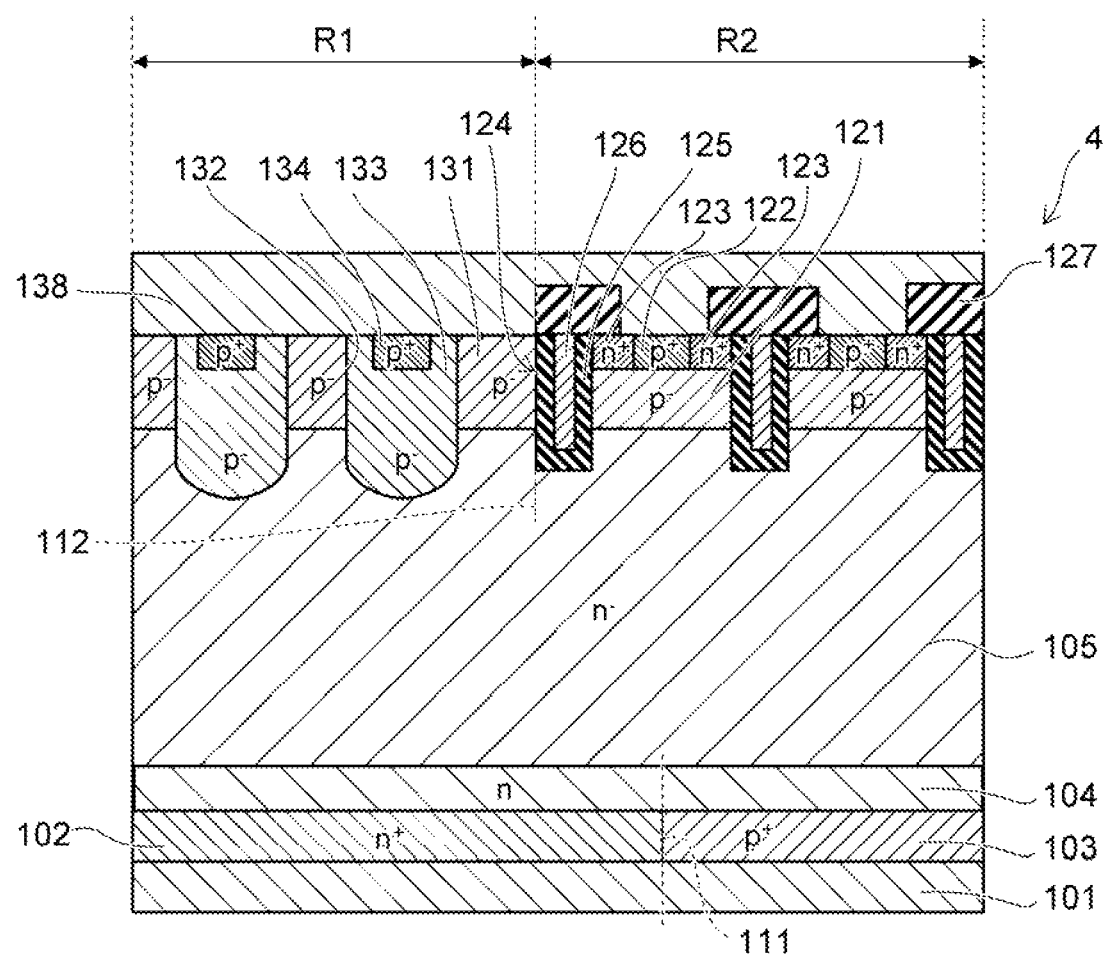
FIG. 5 is a cross sectional view showing a semiconductor device according to a fourth embodiment.

FIG. 5 is a cross sectional view showing a semiconductor device according to the embodiment.

As illustrated in FIG. 5, a semiconductor device 4 according to the embodiment is different from the semiconductor device 1 according to the above-mentioned first embodiment in that the boundary 111 between the cathode layer 102 and the drain layer 103 is not co-planar with the boundary 112 between the trench 124 and the first anode layer 131 in the IGBT region R2.

The structure, operation, and effect of the semiconductor device 4 according to the embodiment other than the above are the same as those of the semiconductor device according to the above-mentioned first embodiment.

Since the cathode layer 102 extends from the diode region R1 into the IGBT region R2, it is effective in improving the diode characteristic such as a reduction of the ON voltage in the diode region.

Modified Example 1 of Fourth Embodiment

Next, a modified example 1 according to the fourth embodiment will be described.

Figure 6:
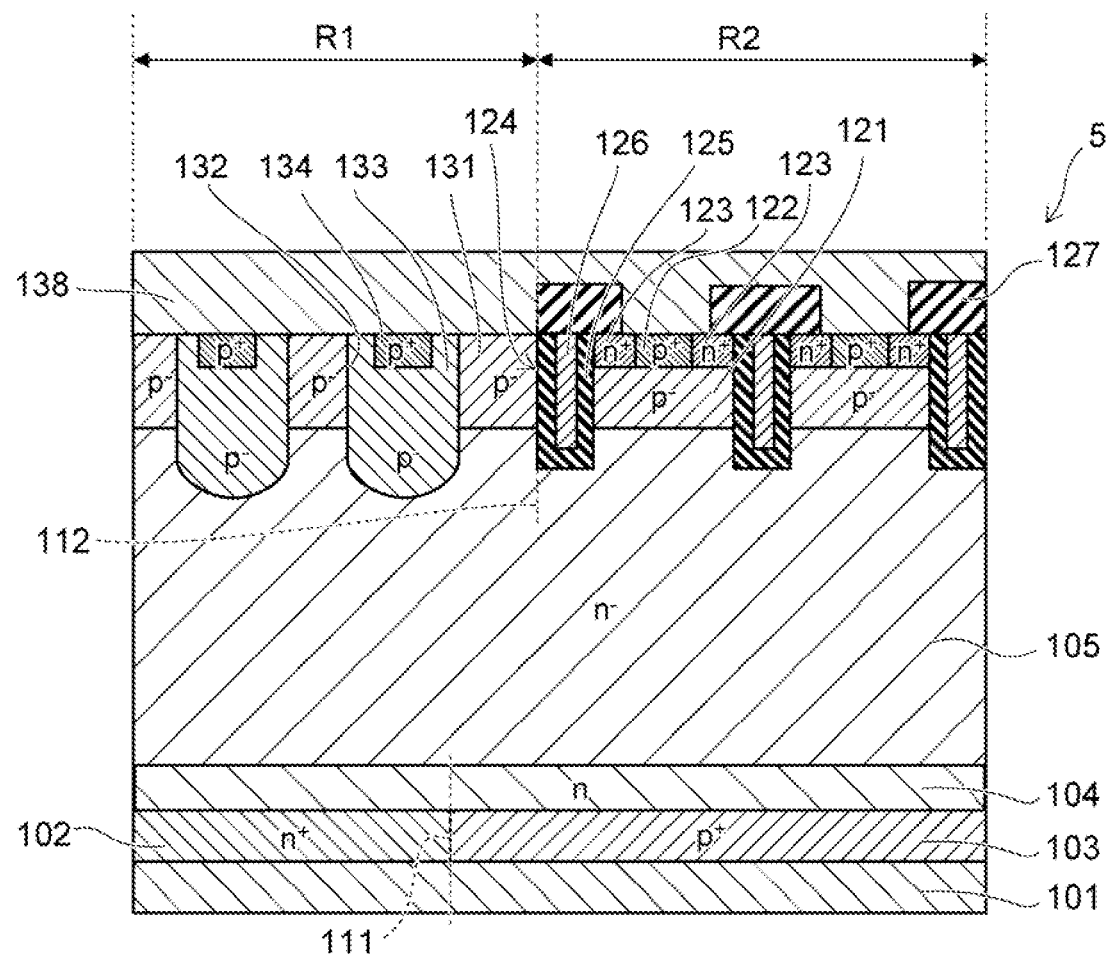
FIG. 6 is a cross sectional view showing a semiconductor device according to a modified example 1 of the fourth embodiment.

FIG. 6 is a cross sectional view showing a semiconductor device according to the modified example.

As illustrated in FIG. 6, a semiconductor device 5 according to the modified example is different from the semiconductor device 1 according to the above-mentioned first embodiment in that the boundary 111 is not co-planar (aligned with) the plane of the boundary 112 but it is found in the diode region R1.

The structure, operation, and effect of the semiconductor device 5 according to the modified example other than the above are the same as those of the semiconductor device according to the above-mentioned first embodiment.

Since the drain layer 103 extends into the diode region R1, it is effective in improving the IGBT characteristics such as a reduction of the ON voltage in the IGBT region R2.

Modified Example 2 of Fourth Embodiment

Next, a modified example 2 of the fourth embodiment will be described.

Figure 7:
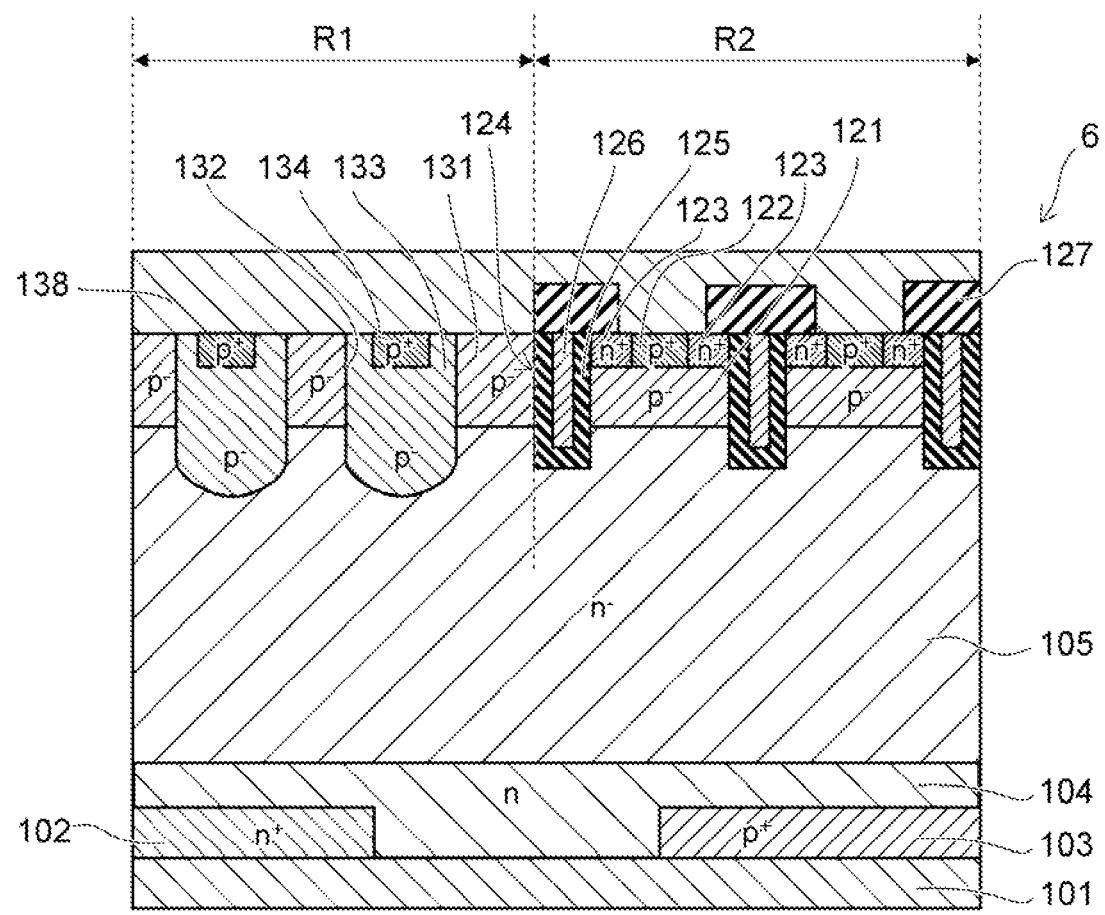
FIG. 7 is a cross sectional view showing a semiconductor device according to a modified example 2 of the fourth embodiment.

FIG. 7 is a cross sectional view showing a semiconductor device according to the modified example.

As illustrated in FIG. 7, a semiconductor device 6 according to the modified example is different from the semiconductor device 1 according to the above-mentioned first embodiment in that the cathode layer 102 is spaced from the drain layer 103 and that a part of the buffer layer 104 enters a region between the cathode layer 102 and the drain layer 103.

The structure, operation, and effect of the semiconductor device 6 according to the embodiment other than the above are the same as those of the semiconductor device according to the above-mentioned first embodiment.

By spacing the cathode layer 102 from the drain layer 103, current concentration in the end portion of the diode region and the end portion of the IGBT region is avoided.

Fifth Embodiment

Next, a fifth embodiment will be described.

Figure 8:
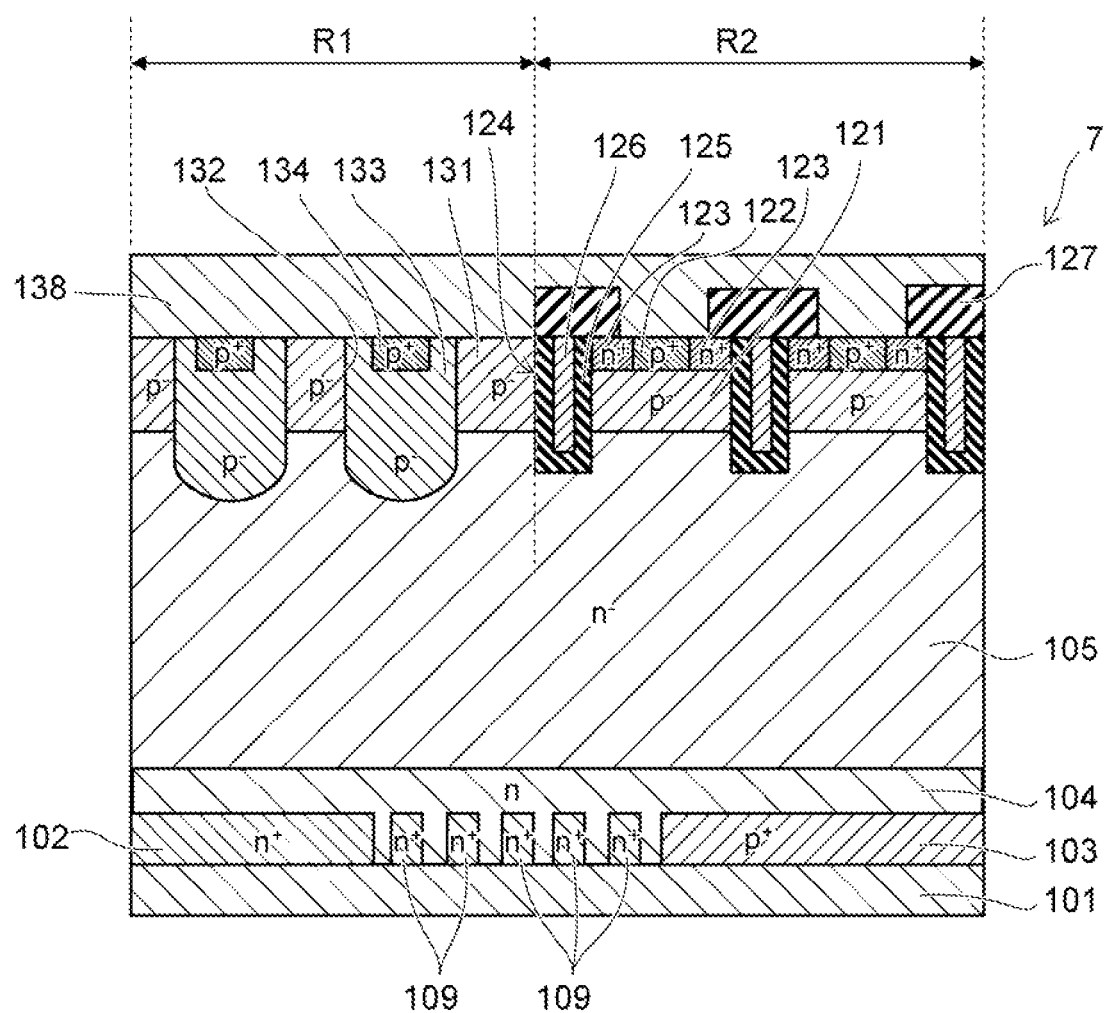
FIG. 8 is a cross sectional view showing a semiconductor device according to a fifth embodiment.

FIG. 8 is a cross sectional view showing a semiconductor device according to the embodiment.

As illustrated in FIG. 8, a semiconductor device 7 according to the embodiment is different from the semiconductor device 6 (refer to FIG. 7) according to the above-mentioned modified example 2 of the fourth embodiment in that one or more n+ type semiconductor layers 109 are provided in a region between the cathode layer 102 and the drain layer 103. The effective dopant concentration of the n+ type semiconductor layer 109 is higher than that of the n type buffer layer 104.

The structure, operation, and effect of the semiconductor device 7 according to the embodiment other than the above are the same as those of the semiconductor device 6 according to the above-mentioned modified example 2 of the fourth embodiment.

Modified Example of Fifth Embodiment

Next, a modified example of the fifth embodiment will be described.

Figure 9:
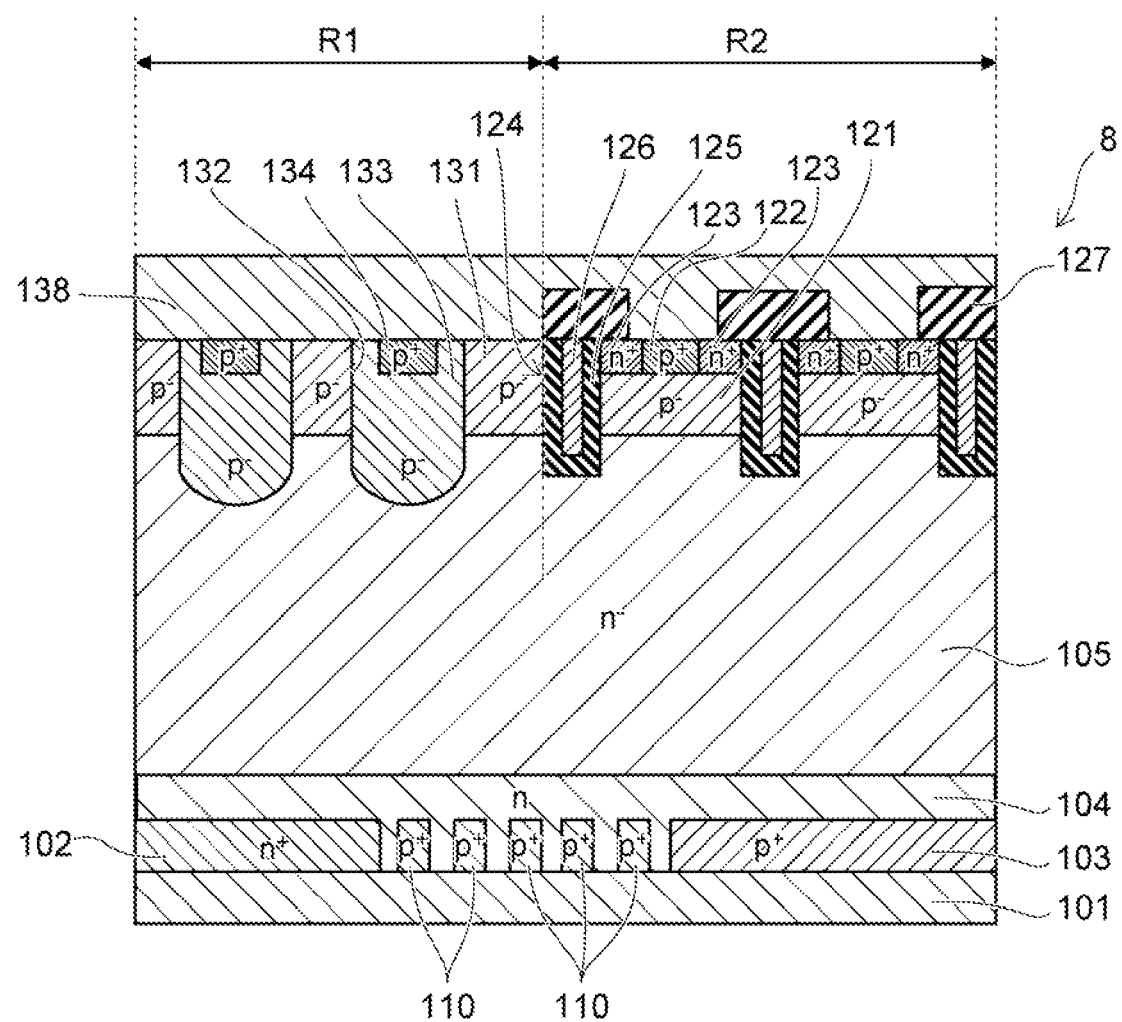
FIG. 9 is a cross sectional view showing a semiconductor device according to a modified example of the fifth embodiment.

FIG. 9 is a cross sectional view showing a semiconductor device according to the modified example.

As illustrated in FIG. 9, the semiconductor device 8 according to the embodiment is different from the semiconductor device 6 (refer to FIG. 7) according to the above-mentioned modified example 2 of the fourth embodiment in that one or more p+ type semiconductor layers 110 are provided in a region between the cathode layer 102 and the drain layer 103. The effective dopant concentration of the p+ type semiconductor layer 110 is higher than that of the p− type second base layer 121.

The structure, operation, and effect of the semiconductor device 8 according to the embodiment other than the above are the same as those of the semiconductor device 6 according to the above-mentioned modified example 2 of the fourth embodiment.

In the semiconductor device according to the embodiment, although an example in the case of providing the second contact layer 134 has been described, the second contact layer 134 does not need to be provided.

According to the above-mentioned embodiments, there is provided a semiconductor device capable of suppressing the element destruction caused by the concentration of the electric field in the bottom portion of the trench.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first electrode;
   a first region including
      a first semiconductor layer of a first conductivity type provided on the first electrode,
      a second semiconductor layer of a second conductivity type provided over the first semiconductor layer,
      a third semiconductor layer of the first conductivity type provided on the second semiconductor layer,
      a fourth semiconductor layer of the second conductivity type selectively provided on the third semiconductor layer, and
      a gate electrode extending through the third semiconductor layer and the fourth semiconductor layer and terminating inwardly of the second semiconductor layer, and separated from the second, third and fourth semiconductor layers by a gate insulating film;
   a second electrode provided on the fourth semiconductor layer; and
   a second region adjacent to the first region, including
      a fifth semiconductor layer of the second conductivity type provided between the first electrode and the second semiconductor layer and adjacent to the first semiconductor layer,
      a sixth semiconductor layer of the first conductivity type provided on the second semiconductor layer in contact with the second electrode, and
      a seventh semiconductor layer of the first conductivity type positioned in the second semiconductor layer and the sixth semiconductor layer such that the furthest extent thereof inwardly of the second semiconductor layer is closer to the first electrode than the bottom portion of the gate insulating film and the sixth semiconductor layer are.

2. The semiconductor device according to claim 1, wherein a distance from a surface of the gate insulating film extending inwardly of the second semiconductor layer to the center, along the same direction, of the nearest seventh semiconductor is seven micrometers or less.

3. The semiconductor device according to claim 1, further comprising
an eighth semiconductor layer of the second conductivity type provided between a surface of the first semiconductor layer and the fifth semiconductor layer and the second semiconductor layer.

4. The semiconductor device according to claim 1, further comprising
a semiconductor layer of the first conductivity type provided on the seventh semiconductor layer inwardly of the sides thereof and contacting the second electrode at a location thereof extending inwardly of the second electrode no further than the contact location of the seventh semiconductor layer and the second electrode.

5. The semiconductor device according to claim 1, wherein the first region further includes
a third electrode extending through the third semiconductor layer and the fourth semiconductor layer and terminating inwardly of the second semiconductor layer, and separated from the second, third and fourth semiconductor layers by a gate insulating film, and electrically connected to the second electrode.

6. The semiconductor device according to claim 1, wherein the boundary between the first semiconductor layer and the fifth semiconductor layer is offset, from the location of the boundary between the sixth semiconductor layer and the gate insulating film, in one of the direction of the gate electrode from the boundary between the sixth semiconductor layer and the gate insulating film and the direction of the seventh semiconductor layer from the boundary between the sixth semiconductor layer and the gate insulating film.

7. The semiconductor device according to claim 3, wherein the eighth semiconductor layer is disposed between the first semiconductor layer and the fifth semiconductor layer.

8. The semiconductor device according to claim 7, further comprising:
in a gap between the first semiconductor layer and the fifth semiconductor layer, a plurality of semiconductor layers of the second conductivity type disposed on the first electrode and spaced from one another, and portions of the eighth semiconductor layer extending inwardly of the spaces between the plurality of semiconductor layers of the second conductivity type and into contact with the first electrode.

9. The semiconductor device according to claim 7, further comprising:
in a gap between the first semiconductor layer and the fifth semiconductor layer, a plurality of semiconductor layers of the first conductivity type disposed upon the first electrode and spaced from one another, and portions of the eighth semiconductor layer extending inwardly of the spaces between the plurality of semiconductor layers of the second conductivity type and into contact with the first electrode.

10. A semiconductor RC-IGBT device formed on a substrate, comprising:
a first semiconductor layer of a first conductivity type having a first side and a second side;
a second semiconductor layer of a second conductivity type disposed on a first region of the first side of the first semiconductor layer;
a third semiconductor layer of a first conductivity type disposed on a second region of the first side of the first semiconductor layer which is physically different from the first region;
at least one gate trench extending inwardly of the second side of the first semiconductor layer;
a gate electrode disposed within the gate trench and spaced therefrom by a gate insulating layer, and the gate insulating layer spaced a first distance from the second side at the base of the trench;
a first anode layer of the second conductivity type, extending inwardly of the second surface of the first semiconductor layer by a second distance less than the first distance; and
a second anode layer of the second conductivity type, extending inwardly of the second surface of the first semiconductor layer by a third distance greater than the first distance.

11. The device of claim 10, further comprising a first electrode extending over the second and third semiconductor layer on a side thereof opposed from the first side of the first semiconductor layer, and a second electrode extending over the gate electrode and the first and second anode layers on a side thereof opposed from the second side of the first semiconductor layer.

12. The device of claim 11, further comprising an insulating layer disposed between the gate electrode and the second electrode.

13. The device of claim 12, wherein
the gate insulating film and the first anode layer abut one another along a surface extending inwardly of the second surface of the first semiconductor layer to form a boundary between an IGBT region and a diode region of the device; and
the distance between the closest extent of the gate insulating layer to the closest second anode is seven micrometers or less.

14. The device of claim 11, further comprising:
a fourth semiconductor layer of the first conductivity type extending into contact with the first electrode in a location intermediate of the second semiconductor layer and the third semiconductor layer.

15. The device of claim 14, further comprising a plurality of semiconductor regions of the first conductivity type disposed on the first electrode in an area between the second and third electrodes, wherein the fourth semiconductor layer extends between the plurality of semiconductor regions of the first conductivity type disposed on the first electrode and into contact with the first electrode.

16. The device of claim 12, wherein the second and third semiconductor layers contact one another at a location on the first surface of the first semiconductor layer.

17. The device of claim 16, wherein the location where the second and third semiconductor layers contact one another on the first surface of the first semiconductor layer is offset in one of the gate electrode, and second anode directions from the boundary between an IGBT region and a diode region of the device.

18. A semiconductor RC-IGBT device formed on a substrate, comprising:
a first semiconductor layer of a first conductivity type having a first side and a second side;
a second semiconductor layer of a second conductivity type disposed on a first region of the first side of the first semiconductor layer;

a third semiconductor layer of a first conductivity type disposed on a second region of the first side of the first semiconductor layer which is physically different from the first region;

at least one gate trench extending inwardly of the second side of the first semiconductor layer;

a gate electrode disposed within the gate trench and spaced therefrom by a gate insulating layer, and the gate insulating layer spaced a first distance from the second side at the base of the trench;

a first anode layer of the second conductivity type, extending inwardly of the second surface of the first semiconductor layer by a second distance;

a second anode layer of the second conductivity type, extending inwardly of the second surface of the first semiconductor layer by a third distance wherein the gate insulating film and the first anode layer abut one another along a surface extending inwardly of the second surface of the first semiconductor layer to form a boundary between an IGBT region and a diode region of the device; and the distance between the closest extent of the gate insulating layer to the closest second anode is seven micrometers or less.

19. The device of claim 18, wherein the third distance is greater than the first distance.

20. The device of claim 19, wherein the third distance is greater than the second distance.

* * * * *